United States Patent
Cheng

(10) Patent No.: US 10,461,220 B2
(45) Date of Patent: Oct. 29, 2019

(54) METHOD OF MANUFACTURING A SEMICONDUCTOR DEVICE AND A SEMICONDUCTOR DEVICE

(71) Applicant: IMEC, Leuven (BE)

(72) Inventor: Kai Cheng, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/579,889

(22) Filed: Dec. 22, 2014

(65) Prior Publication Data

US 2015/0179883 A1    Jun. 25, 2015

Related U.S. Application Data

(62) Division of application No. 12/980,225, filed on Dec. 28, 2010, now abandoned.

(Continued)

(30) Foreign Application Priority Data

Dec. 30, 2009 (EP) .................................... 09180938

(51) Int. Cl.
*H01L 33/22* (2010.01)
*H01L 33/00* (2010.01)
(Continued)

(52) U.S. Cl.
CPC .......... *H01L 33/22* (2013.01); *H01L 21/0259* (2013.01); *H01L 21/02639* (2013.01);
(Continued)

(58) Field of Classification Search
CPC ..... H01L 33/22; H01L 33/18; H01L 33/0075; H01L 33/32; H01L 33/0062;
(Continued)

(56) References Cited

U.S. PATENT DOCUMENTS 7,071,494 B2    7/2006  Steigerwald et al.
7,244,957 B2    7/2007  Nakajo et al.
(Continued)

FOREIGN PATENT DOCUMENTS

EP         0977280         2/2000
WO    WO 2005/064666      7/2005
(Continued)

OTHER PUBLICATIONS

Koleske et al. (2003). In situ measurements of GaN nucleation layer decompostion. Appl. Phys. Lett. 82, 1170 (2003); https://doi.org/10.1063/1.1555264.*

(Continued)

*Primary Examiner* — Lauren R Bell
(74) *Attorney, Agent, or Firm* — Knobbe, Martens, Olson & Bear LLP

(57) ABSTRACT

A method of manufacturing a semiconductor device and the device resulted thereof is disclosed. In one aspect, the device has a heterogeneous layer stack of one or more III-V type materials, at least one transmission layer of the layer stack having a roughened or textured surface for enhancement of light transmission. The method includes (a) growing the transmission layer of a III-V type material, (b) providing a mask layer on the transmission layer, the mask layer leaving first portions of the transmission layer exposed, and (c) partially decomposing the first exposed portions of the transmission layer. Suitably redeposition occurs in a single step with decomposition, so as to obtain a textured surface based on crystal facets of a plurality of grown crystals. The resulting device has a light-emitting element. The transmission layer hereof is suitably present at the top side.

18 Claims, 3 Drawing Sheets

Related U.S. Application Data

(60) Provisional application No. 61/293,094, filed on Jan. 7, 2010.

(51) Int. Cl.
  *H01L 21/02* (2006.01)
  *H01L 33/18* (2010.01)
  *H01L 33/32* (2010.01)
  *H01L 31/0236* (2006.01)

(52) U.S. Cl.
  CPC .... *H01L 21/02664* (2013.01); *H01L 33/0062* (2013.01); *H01L 33/0066* (2013.01); *H01L 33/0075* (2013.01); *H01L 33/18* (2013.01); *H01L 33/32* (2013.01); *H01L 21/0254* (2013.01); *H01L 21/0262* (2013.01); *H01L 21/02587* (2013.01); *H01L 21/02609* (2013.01); *H01L 31/0236* (2013.01); *H01L 2933/0058* (2013.01); *H01L 2933/0091* (2013.01)

(58) Field of Classification Search
  CPC ..... H01L 2933/0091; H01L 2933/0058; H01L 21/02587; H01L 21/0262; H01L 21/0254; H01L 31/0236; H01L 21/02664–02672; H01L 21/0259; H01L 21/02595; H01L 21/02598; H01L 21/02609
  USPC ......... 257/13, E33.008, E33.074; 438/22, 29
  See application file for complete search history.

(56) References Cited

U.S. PATENT DOCUMENTS

| | | | | |
|---|---|---|---|---|
| 2004/0051099 A1* | 3/2004 | Moustakas | ............ | C30B 25/14 257/49 |
| 2004/0119082 A1 | 6/2004 | Sugawara | | |
| 2005/0116215 A1* | 6/2005 | Hooper | ............ | B82Y 20/00 257/14 |
| 2005/0224816 A1* | 10/2005 | Kim | ............ | H01L 33/32 257/79 |
| 2006/0094138 A1 | 5/2006 | Lai et al. | | |
| 2008/0135856 A1 | 6/2008 | Moon | | |
| 2008/0142814 A1 | 6/2008 | Chu et al. | | |
| 2009/0087994 A1 | 4/2009 | Lee et al. | | |
| 2010/0224854 A1* | 9/2010 | Lee | ............ | H01L 33/20 257/13 |

FOREIGN PATENT DOCUMENTS

| | | |
|---|---|---|
| WO | WO 2010/066794 | 6/2010 |
| WO | WO 2010/066795 | 6/2010 |

OTHER PUBLICATIONS

Auger, M.A., et al., Structure and morphology evolution of ALN films grown by DC sputtering, Surface and Coatings Technology 180-181, pp. 140-144 (2004).

Fujino, T., et al., Thermal Stability in the Morphology of Ge Films on Si(001) Grown by Hydrogen-Surfactant-Mediated Epitaxy, Japanese Journal of Applied Physics, vol. 42, Part 2, No. 1 A/B, pp. L63-L66 (2003).

Mastro, M.A., et al., Thermal Stability of MOCVD and HVPE GaN Layers in $H_2$, HCl, $NH_3$, $N_2$, phys. Stat. sol. (a) 188, No. 1, pp. 467-471 (2001).

European Search Report dated May 27, 2010 in European Patent Application No. 09180938.4.

Koleske et al., "Understanding GaN nucleation layer evolution on sapphire," *Journal of Crystal Growth*, vol. 273, Issues 1-2, Dec. 17, 2004, pp. 86-99, ISSN 0022-0248, http://dx.doi.org/10.1016/j.jcrysgro.2004.08.126. (http://www.sciencedirect.com/science/article/pii/S0022024804009923).

Mitchell et al., "Mass transport in the expitaxial lateral overgrowth of gallium nitride," *Journal of Crystal Growth*, vol. 222, Issues 1-2, Jan. 2001, pp. 144-153, ISSN 0022-0248, http://dx.doi.org/10.1016/S0022-0248(00)00874-5. (http://www.sciencedirect.com/science/article/pii/S0022024800008745).

\* cited by examiner

METHOD OF MANUFACTURING A SEMICONDUCTOR DEVICE AND A SEMICONDUCTOR DEVICE

CROSS REFERENCE TO RELATED APPLICATIONS

This application is a divisional of U.S. patent application Ser. No. 12/980,225, which claims priority under 35 U.S.C. § 119(e) to U.S. Provisional Patent Application No. 61/293,094, filed Jan. 7, 2010, the disclosures of which are hereby incorporated by reference in their entireties.

BACKGROUND OF THE INVENTION

Field of the Invention

The disclosure relates to a method of manufacturing a semiconductor device comprising a GaN-containing heterogeneous layer stack and a roughened surface for light transmission.

The disclosure also relates to a semiconductor device comprising a GaN-containing heterogeneous layer stack on a substrate, the stack comprising a n-type doped layer and a p-type doped layer, the stack having a GaN top layer with first areas having a roughened surface suitable for light transmission.

Description of the Related Technology

It is known in the art that the light emission from an electroluminescent device or from a light emitting semiconductor diode (a LED) is limited by the total internal reflection occurring at the interface between the semiconductor substrate wherein the device is fabricated and the surrounding medium. Mostly emission of the light to air, with refractive index of unity, is intended. The semiconductor typically has a refractive index $n_s$ of 2 to 4. For instance, the refractive index of GaN and AlN are 2.46 and 2 respectively. Snell's law determines that only photons arriving at the semiconductor-air interface with an angle smaller than a critical angle $\theta c = \arcsin(1/ns)$ can espace to the air. All other photons are totally reflected at the semiconductor-air interface, and therefore remain in the semiconductor substrate, until eventually they are re-absorbed. Typically, the critical angle for total internal reflection is in the range of 10-20° C. Hence, total internal reflection limits the number of photons escaping the semiconductor substrate to those photons arriving at the semiconductor-air interface with an angle below the critical angle. Only a few percent of the photons generated inside the semiconductor substrate comply with this condition. In order to extract more light from LEDs, efforts have been ongoing for several decades that included wet-chemical etching of a LED surface, employing periodic photonic crystals, planar graded refractive index antireflection coatings, patterning of substrates, particularly of sapphire substrates, and shaping of LED chips.

EP0977280 discloses the provision of a roughened surface to improve such light transmission, in particular, light emission, from a semiconductor device such as a LED. A roughened surface provides other angles making that light emitting in an angle relatively perpendicular to the substrate plane still can leave the substrate. Moreover, these angles lead to reflection and recombination with an improved chance of subsequent emission. This leads to overall quantum efficiencies in the order of 20 to 30%. The surface roughening is therein achieved by application of a substantially random distribution of particles on the surface, by reducing the size of the particles and thereafter etching the surface while using the particles as a mask. Preferably, use is made of a monolayer of closed packed colloidal particles. The diameter is reduced by application of an oxygen plasma. The size of the colloidal particles is not strongly critical, but preferentially they have a diameter $\lambda_s$ that is 50% to 200% of the wavelength of the light in the semiconductor ($\lambda_s = \lambda_0/n_s$, with $\lambda_0$ the wavelength in vacuum and $n_s$ the refractive index of the semiconductor). An alternative is the use of a mask provided by a photoresist. This is particularly relevant for red, near-infrared and infrared LEDs, since for these wavelengths the required texturing features are of the order of 200 nm or larger. This resolution can be achieved by UV or deep UV illumination of a suitable photoresist. EP0977280 discusses specifically GaAs-type layers. However fabrication of submicron patterns by lithography and plasma dry etching is costly, and the etching process could damage the surface of GaN.

Wet-chemical texturing of an N-face GaN (000-1) surface of vertical-structured LEDs is disclosed in WO2005/064666. The N-face is the bottom GaN layer when seen in the order of processing. This etching occurs after transfer of the LED to another carrier and removal of the processing substrate, typically sapphire. The p-type doped GaN layer that is the top layer when seen in the order of processing, is however too thin for carrying out the texturing. Wet-chemical etching is known to be very efficient in enhancing light extraction, and hence, is widely used in high-power commercial LEDs. However, KOH-based wet-chemical etching needs additional process steps such as deposition and removal of a protection layer covering ohmic contact to the n-type GaN. In addition, due to crystal-plane-dependent etching rates, it is very difficult to form non-random, optimized or designed features.

One alternative method is disclosed in U.S. Pat. No. 7,071,494. Use is made herein of specific growth properties of AlN and AlGaN with an Al-content of at least 50%. Growth herein may occur initially in the form of well textured regions (e.g. crystalline islands) instead of a rather randomly oriented matrix, such as explained in M. Auger et al, Surface and Coatings Technology 180-181 (2004), 140-144. Thereafter, the material is annealed such that the material becomes crystalline. Subsequently, portions of the annealed layer that surround large stable grains are optionally etched away with $H_2$, $N_2$, $NH_3$, HCl and mixtures thereof to form a textured layer. In embodiments where the growth favors three dimensional growth (i.e. crystalline islands), annealing may be sufficient to form the textured layer. A planarizing layer is deposited on top of the textured layer.

The result of this known method is a textured surface of large crystal grains of AlN or Al-rich AlGaN, which is overgrown by a planarizing layer of GaN. We observe that the planarizing layer herein effectively reduces the refractive effect of the textured surface, as the difference of the refractive indices of AlN and GaN is less than that between AlN and air or an organic material. Apparently, the insight of U.S. Pat. No. 7,071,494 is that the combination of a textured surface with a planarizing layer provides a suitable surface roughness.

It is however a disadvantage of this known method that the combination of a textured surface of AlN or Al-rich AlGaN and a planarizing surface is a very complex and thus expensive structure for obtaining a roughened surface. Moreover, this method of creating a roughened surface shares with the wet-etching the disadvantage that it is very difficult to form non-random, optimized or designed features. As admitted in U.S. Pat. No. 7,071,494, the large, stable grains will survive the etching process, whereas other portions are etched away.

SUMMARY OF CERTAIN INVENTIVE ASPECTS

A first inventive aspect relates to a method of manufacturing a semiconductor device comprising a heterogeneous layer stack of one or more III-V type materials, at least one transmission layer of the layer stack having a roughened surface for enhancement of light transmission. The method comprises 1) growing the transmission layer of a III-V type material, 2) providing a mask layer on the transmission layer, the mask layer leaving first portions of the transmission layer exposed, and 3) partially decomposing the first exposed portions of the transmission layer, therewith obtaining the roughened surface.

The inventor has been found to his surprise that the decomposition step results in the formation of an adequate roughened surface, but only if a mask layer is present on the transmission layer, first portions of the transmission layer being exposed.

In a most preferred embodiment, redeposition of the III-V material is carried out generating crystal facets defining a textured surface. The formed crystal facets overcome a major disadvantage of the prior art: the size is relatively uniform. Moreover, the method can be tuned so as to vary density and size of the crystal facets. Furthermore, the transmission layer with crystal facets is stable.

The redeposition suitably occurs in a single step with the decomposition of the transmission layer. This is particularly achieved by tuning the composition of the atmosphere in which the single step decomposition and redeposition is carried out. Particularly, this is a nitrogen-rich atmosphere. Atoms liberated by the decomposition are then redeposited, but at another location on the surface that is more energetically favorable.

Suitable materials for the transmission layer are materials that have a relatively low decomposition temperature, particularly lower than about 1250° C. Use of such materials for the transmission layer enabled to carry out the step in a controlled manner. Moreover, damage to other layers within the heterogeneous layer stack is kept at a low level. Preferably, the step is carried out at a lower temperature than about 1250° C., for instance in a range of about 800-1150° C. Suitable materials include GaN, InN, InGaN and Al-poor alloys of these materials, such as $Al_xGa_{1-x}N$, with $x \leq 0.3$. In the suitable embodiment that the transmission layer forms also the p-type doped layer of the light emitting diode, the decomposition step may be combined with one of the anneal steps typically carried out on the p-type doped layer. This is however not necessary In a most suitable embodiment, the transmission layer is present on a stop layer. The stop layer remains intact when decomposing the transmission layer. The use of such a stop layer is a gentle manner of defining an end point to the decomposition treatment. As such, it can further be exploited to define the size of the crystals. Suitably, the stop layer comprises a material different from the transmission layer. One advantageous implementation hereof is that the material of the stop layer has a decomposition temperature higher than that of the transmission layer. A most suitable combination is that of a transmission layer of GaN and a stop layer of AlGaN.

According to a second aspect of the disclosure, a semiconductor device is provided that comprises a heterogeneous layer stack of one or more III-V type materials. At least one transmission layer of the layer stack has a roughened surface for enhancement of light transmission obtainable by the method.

According to a third aspect of the disclosure, a semiconductor device is provided that comprises a heterogeneous layer stack of one or more III-V type materials. At least one transmission layer of the layer stack has a roughened or textured surface for enhancement of light transmission. Herein the surface is a textured surface defined by crystal facets of a plurality of crystals grown in first exposed portions of the transmission layer, the plurality being in a range of about $0.01\text{-}1000 \cdot 10^6/mm^2$.

In one aspect, the transmission layer is provided with a textured surface in the form of a plurality of crystals having crystal facets. The plurality is particularly a large number, e.g. about $0.01\text{-}1000 \cdot 10^6/mm^2$, preferably about $0.1\text{-}100 \cdot 10^6/mm^2$, particularly about $1\text{-}50 \cdot 10^6/mm^2$. Suitably, the diameter of a single crystal is in the range of about 50 to 800 nm. Therewith, the surface is textured in a homogeneous manner, e.g. the crystals are sufficiently fine, and nevertheless with sufficiently large crystal facets to increase the transmission of radiation. The crystals are grown here, as a consequence of the redeposition step. This in-situ and actual growth results in better and more uniform shapes than obtained when the textured surface are created by etching.

In one particular embodiment, the textured surface is made to be optically transparent for a selected range of wavelengths. This selected range of wavelengths suitably corresponds to the wavelength of the radiation emitted by the semiconductor device, i.e. any light emitting diode or transistor therein. The transparency for other wavelengths is then typically less than the transparency for the selected range. The range of wavelengths may be defined by tuning the formation of the crystals, and particularly thereof the depth to which the transmission layer is decomposed for the formation of the textured surface. Optionally, the transmission layer is present on a stop layer that defines the depth to which the transmission layer is decomposed. The wavelength may be further tuned by setting the atmosphere in which decomposition occurs (more specifically the nitrogen-content of the atmosphere defining the speed of redeposition). Additionally, the material of the transmission layer can be varied.

The textured surface is obtained particularly by decomposition through a mask. In one advantageous embodiment, at least a portion of the area defined by the mask is subsequently used for the provision of a contact. The mask may herein be removed completely and then replaced by a metal contact. Alternatively, holes may be defined through the mask. The mask areas are very suitably for subsequent layer deposition due to the planarity of their surface.

As is hereinabove specified with reference to the method, the transmission layer suitably comprises a material with a relatively low decomposition temperature, particularly lower than about 1250° C. Use of such materials for the transmission layer enabled to carry out the step in a controlled manner. Moreover, damage to other layers within the heterogeneous layer stack is kept at a low level. Preferably, the step is carried out at a lower temperature than about 1250° C., for instance in a range of about 800-1150° C. Suitable materials include GaN, InN, InGaN and Al-poor alloys of these materials, such as $Al_xGa_{1-x}N$, with $x \leq 0.3$.

The device suitably comprises further at least one light emitting element, such as a light emitting diode. Preferably, the light emitting diode is a blue light emitting diode (LED). It has been found that the size of the crystals matches best with blue light, which can be generated most advantageously in GaN-based LEDs. The term blue LED is herein to be understood to refer to a LED able of emitting of blue, violet and/or ultraviolet light, i.e. with a wavelength suitable in the range between about 300 and 500 nm, particularly between about 400 and 500 nm and especially between about 450 and 500 nm.

Alternatively, the device may be a solar cell or a hydrogen generator. The latter device is particularly a device based on a InGaN layer that is in operation present within a reservoir of water or an aqueous solution. A junction is then formed between the InGaN and the water. This junction may split water into hydrogen and oxygen, upon provision of a suitable voltage to the InGaN.

Suitably, the textured surface is present at a top side of the device when seen in the order of processing. Typically, this top side is the side at which the p-type GaN is present. This evidently has the advantage that it takes away the need of removing the processing substrate. In one implementation the textured surface is covered with a silicon nitride protection layer. Such a silicon nitride layer forms an adequate passivation, and it is optically transparent and has an adequate reflection coefficient. A most suitable version thereof is an in-situ silicon nitride layer, which is a silicon nitride layer that is deposited with chemical vapor deposition, subsequent to other processing. Particularly, it is deposited without an intermediate cooling step to room temperature.

In a further implementation, the presence of the textured surface on the top side is combined with the presence of an optical element on the bottom side of the device (e.g. the side of the processing substrate). Such optical element is more particularly a grating or a mirror. This element is intended for reflecting and/or otherwise guiding the generated light. As a result, the light may be directed to the top side, where it adds to the overall efficiency. Moreover, such reflection or guiding suitably changes the orientation of the light. It then may have a higher chance to escape from the element into the air.

According to a fourth aspect of the disclosure, an electronic device for confinement of radiation is provided. The radiation is confined into a nanostructure, located within a substrate of the electronic device, by means of surface plasmonic structures on a surface of the substrate. Herein, the surface is a textured surface defined by crystal facets of a plurality of crystals of a transmission layer of a III-V material.

It has turned out that a textured surface defined by crystal facets is highly suitable for use as a surface plasmonic structure. In a most suitable implementation, it is thereto covered, at least partially, with an electrically conductive layer, such as a metal, or a conductive nitride or both. The conductive layer is deposited conformally so as not to loose the textured structure. The nanostructure is for instance a cavity or a pore. The textured surface is most suitably prepared by the method. Alternative methods are however not excluded. The nanostructure is suitably defined in an area covered by a mask during the formation of the textured surface. This device is suitably used for the detection of properties of individual molecules, and more particularly biomolecules such as DNA molecules, proteins and the like. Thereto, suitably radiation transmitted through the nanostructure is detected. The principle hereof is described in the non-prepublished application PCT/EP2009/066737 in Applicant's name, which is herein incorporated by reference.

In one important embodiment, a light emitting element is present for emission of radiation that is directed to the nanostructure through the surface plasmonic structures. A separate laser is conventionally used as a light source in optical detection. The combination of a light emitting element and the textured surface acting as a surface plasmonic structure may replace the separate laser. This replacement simplifies the set up of such optical detection apparatus and moreover reduces cost considerably.

In a further implementation, the electronic device is used in an apparatus further comprising means for translocating molecules through the nanostructure and a detection unit for detecting electromagnetic radiation at least partially generated by excitation of surface plasmon polaritons in the nanostructure and exiting from the nanostructure. The apparatus additionally comprises a light source that is either the light emitting element in the device or an external light source, or a combination of both.

DETAILED DESCRIPTION OF CERTAIN ILLUSTRATIVE EMBODIMENTS

Figure 1A:
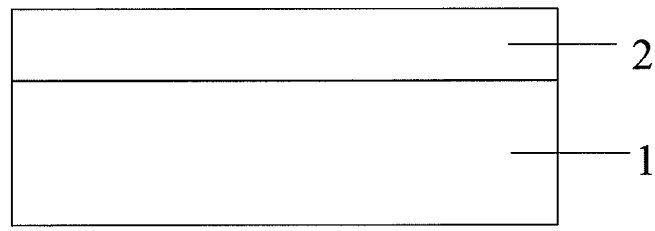
FIG. 1a-d is a series of diagrammatical, cross-sectional views of stages in the method according to a first embodiment

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure. Equal reference numerals in different figures refer to same or like elements.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

FIG. 1a-d is a series of diagrammatical, cross-sectional views of stages in the method according to a first embodiment. The method starts with the configuration of FIG. 1a comprising a substrate 1 and a transmission layer 2 of a III-V material. The substrate 1 typically comprises a stack of layers of a III-V material which defines a light emitting element. The combination of such layer stack in the substrate 1 with the transmission layer 2 constitutes the heterogeneous layer stack of III-V material as recited in the claims.

A suitable configuration of the stack of layers is a quantum well structure interposed between a first device layer that is n-type doped, and a second device layer that is p-type doped. Manufacturing related reasons make that the n-doped layer is usually the bottom layer and the p-doped layer is the top layer. The quantum well structure suitably comprises a stack of alternatingly a first layer and a second layer. Most suitably, the quantum well structure comprises first layers of GaN and second layers of InGaN. The first and the second device layer are typically GaN layers. Suitably, the transmission layer 2 is present on top of the active layer stack, e.g. the quantum well structure and the first and second device layers. It is however not excluded, that the transmission layer is the first or the second device layer.

The stack is preferably grown on a silicon substrate, which allows processing in semiconductor fab environments. Good results have been obtained with a silicon (111) substrate, suitably on top of a handling wafer and a buried insulating layer, such a structure also known as an SOI-wafer with a Si(111) device layer. The GaN layers are grown on the (111) silicon, for which a nucleation layer and thereafter a buffer layer are deposited. In order to match the lattice constant of Si(111) as good as possible, it is deemed beneficial that the buffer layer comprises $Al_xGa_{1-x}N$, wherein x is equal or smaller to 1. Suitably, the Al-content decreases with the distance to a top surface of the Si(111) substrate, either gradually or in steps. However, the Si(111) is by no means the only useful substrate material, alternatives including for instance Si(001) and sapphire. Moreover, $Al_xGa_{1-x}N$, wherein x is equal or smaller to 1, is certainly not the only possible buffer layer. The skilled person in the art of GaN epitaxy will be able to find alternatives in the literature.

Furthermore, while the p-doped GaN layer may be the top layer in the sequence of grown layers, it is not excluded that the transmission layer is provided on the n-type doped GaN. This is then suitably carried out, after that the top layer is attached to another carrier and the substrate used for processing has been removed at least partially. As a silicon substrate may be removed easily by wet or dry chemical etching, this is a further reason to use a silicon substrate (or SOI) as the processing substrate. The transmission layer 2 may in this case be grown either before the growth of the other layers in the structure or after removal of the processing substrate.

It is observed for reasons of clarity that a light emitting diode, in an implementation with a quantum well structure, has been taken as light emitting element in the present description. Another light emitting element, such as a light emitting transistor, and another implementation of a light emitting diode, could be applied as an alternative. Moreover, the III-V material of the layer stack in the above mentioned example comprises GaN and InGaN as functional layers. This is merely an example and other III-V materials and/or a different stack of such materials may be used. Typical examples include AlGaN, InAlGaN.

Figure 1B:
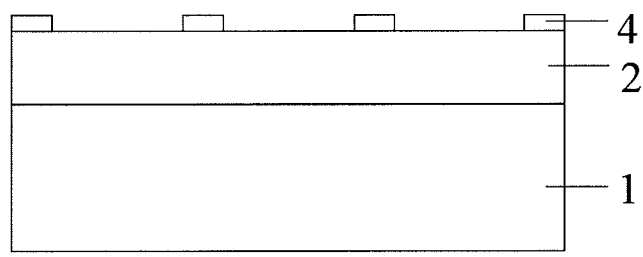

FIG. 1b shows a second stage in the manufacturing of the device. Herein a mask 4 has been applied on a surface of the transmission layer 2. The mask suitably comprises a dielectric material. Good results have been obtained with $SiO_2$. It is preferably a material onto which no growth of GaN or like materials occurs. The mask layer is provided with a pattern so as to create windows between mask portions. The window defining exposed portions of the transmission layer may have a rectangular, oval, circular or other shape, such as a T-shape. The width of the windows is suitably smaller than about 50 microns and typically larger than about 0.5 microns. Good results have been obtained in first experiments with widths varying from approximately 3 to 20 microns.

The transmission layer suitably comprises a material with a relatively low decomposition temperature, particularly lower than about 1250° C. at atmospheric pressure. Use of such materials for the transmission layer enabled to carry out the decomposition step in a controlled manner. Moreover, damage to other layers within the heterogeneous layer stack is kept at a low level. Suitable materials include GaN, InN, InGaN and Al-poor alloys of these materials, such as $Al_xGa_{1-x}N$, with $x \leq 0.3$. Layers of AlN and Al-rich AlGaN, for instance $Al_xGa_{1-x}N$, with $x \geq 0.5$, have a higher decomposition temperature than about 1250° C. at atmospheric pressure.

Figure 1C:
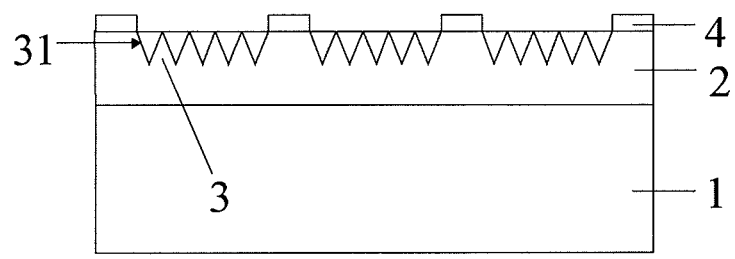

FIG. 1c shows a third stage in the manufacturing of the device. Herein, decomposition and suitably also redeposition takes place. Preferably, the step is carried out at a lower temperature than about 1250° C., for instance in a range of about 800-1150° C. Particularly good results have been obtained in the range from about 1000 to 1150° C. It is typically carried out in a Chemical Vapor Deposition reactor, such as typically in use for the growth of III-V materials. The redeposition rate is influenced by setting the nitrogen content in the atmosphere. The nitrogen-content herein particularly refers to nitrogen available for reacting with decomposed Ga into GaN. One suitable manner involves the use of ammonia ($NH_3$). Very good results have been obtained with combinations of ammonia and hydrogen ($H_2$). Mixtures of oxygen and nitrogen could be used alternatively. Preliminary experiments showed that a threshold of the nitrogen content exists: only decomposition (i.e. no redeposition) is found to take place below a threshold level. The actual threshold appears dependent on typical process conditions such as the temperature of operation, the material of the transmission layer, and other gases present in the atmosphere. The equipment in use may further play a role.

A plurality of crystals 3 with crystal facets 31 defining the textured surface are thus formed. The crystal facets 31 for instance have a (10-10) or (1-101) orientation in case that the transmission layer comprises GaN. The overall shape of the crystals typically is pyramidal. GaN has a hexagonal structure so that the crystals have a ground plane with a hexagonal shape. Each of the crystal facets then has a triangular shape. It is observed that the actual shape could be different or modified, or at least less perfect. In comparison to a textured surface created by wet-chemical etching it was found that the present structure is more regular. The variation in size, particularly height is reduced, for instance to a standard deviation of less than about 100 nm, preferably less than about 50 nm. The density of crystals is typically reduced, due to the redeposition process in which adsorption occurs at locations with minimum energy, e.g. in an appropriate crystal lattice.

Figure 5:
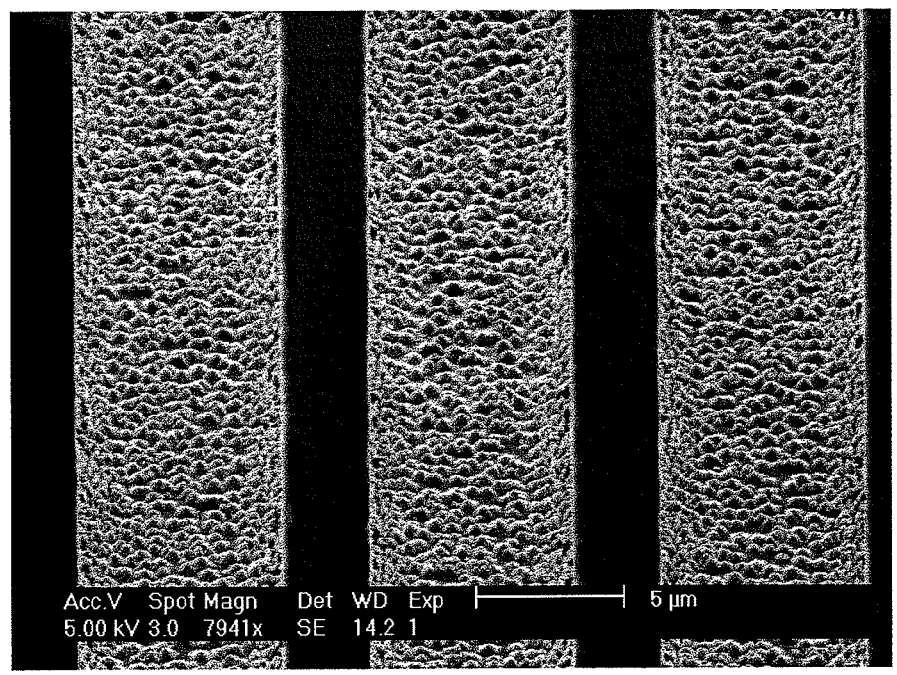
FIG. 5 is an image made by scanning electron microscopy (SEM) of the textured surface in accordance with one embodiment.

FIG. 5 is an image made by scanning electron microscopy (SEM) from a textured surface made in accordance with one embodiment. The black stripes are the masks, in between of which a crystals with crystal facets are present. A scale indicator is included, demonstrating a distance between neighboring masks of approximately about 7 microns in this example. Further measurements on the shown example show that an individual crystal facet had a width of about 353 nm and a height of about 385 nm. Several experiments were carried out with temperatures of 1000 and 1100° C., growth durations of 1 and 10 minutes in an atmosphere of 8 slm $NH_3$ and 7 slm $H_2$. All resulted in the growth of crystals.

However, when reducing the NH$_3$ concentration to 2 about slm, merely some roughening was observed.

The option of decomposition without redeposition may further be exploited to optimize the shape of the crystals formed in the step. For instance, the generation of the textured surface may be finalized with a step below the threshold level. The decomposition occurring then may give rise to modifications of the overall shape of the textured surface and/or to the size of crystal facets.

Figure 1D:
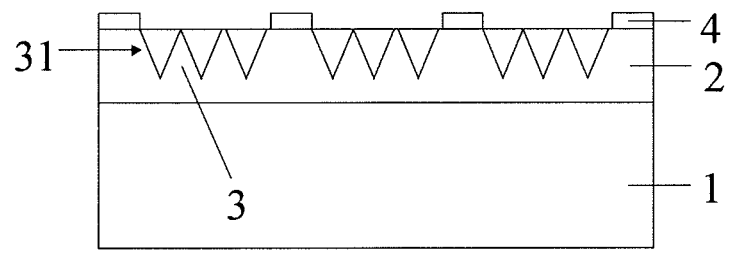

FIG. 1d shows the result of a further optional stage. In this further optional stage the decomposition is continued, resulting in a smaller amount of crystals having crystal facets of larger size and having a larger diameter. Since the diameter of the crystals is in the range of the wavelength light (about 300-800 nm), an increase in the diameter of the crystals makes the textured surface more suitable for light transmission of light of larger wavelength (for instance from blue to orange).

Figure 2:
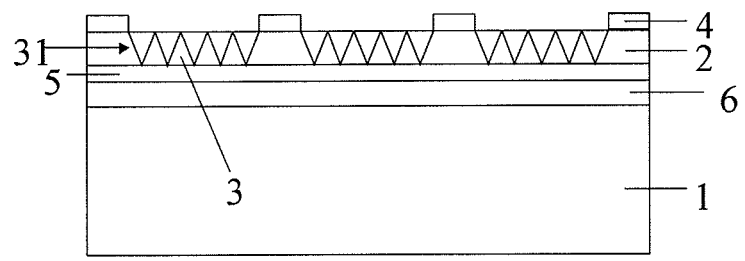
FIG. 2 is a diagrammatical, cross-sectional view of the result of the method according to a second embodiment

FIG. 2 shows the result of the manufacturing according to a further embodiment. Herein, a stop layer 5 is present. The stop layer 5 is suitably present on other layers 6 on top of a substrate 1. The stop layer 5 preferably has a decomposition temperature higher than the transmission layer 2. When GaN is chosen as the material of the transmission layer 2, AlN or Al-rich AlGaN is a good choice for the stop layer 5. When InGaN is chosen as the material of the transmission layer 2, AlN, AlGaN, but also GaN may be chosen as the material of the stop layer 5. The stop layer 5 is effective so as to stop the decomposition and redeposition step at a predefined stage of processing. As in the previous embodiment, the transmission layer 2 may be suitably doped to constitute a p-type doped layer that is part of a light emitting layer stack further comprising an n-type doped layer and a quantum well structure. A suitable dopant is for instance Mg. The stop layer 5 is then suitably inserted between p-type doped layer or layers 6 and the transmission layer 2. It is not excluded that both the layer 6 and the transmission layer are p-type doped. Additionally, the stop layer 5 may be p-type doped as well. However, the dopant concentration may vary.

The semiconductor device with the textured surface may subsequently be provided with at least one electrode and suitably a protection layer. One suitable implementation for the electrode is the definition in one or more of the areas covered by the mask layer 4. The mask layer 4 could be replaced by one or more metal contact. Stripe-shaped metal contacts are adequate for providing sufficient surface area without hampering transmission of light too much. A suitable metal is for instance a metal that may be applied as underbump metallization (UBM) for subsequent assembly. Typical material include for instance Nickel (Ni), Tin (Sn), Lead (Pb) and alloys of such metals. Instead of replacing the mask layer after the texturing by a metal contact, the mask layer could comprise the metal, or alloy. If desired, the transmission layer 2 may be locally removed, for instance by laser or electron beam irradiation, but alternatively by covering the textured surface with another mask such as a photoresist. Alternatively, dopants may be implanted at the area of the contact. Another suitable implantation involves the provision of an optically transparent, electrically conductive layer on top of the textured surface. A suitable material is for instance indium tin oxide, but tin oxide and electrically conductive polymers may be applied instead.

Suitable protection layers include first of all a passivation layer, and additionally a molding compound. Materials for these protection layers are well known in the art and include silicon nitride, polyimide, epoxy.

Figure 3A:
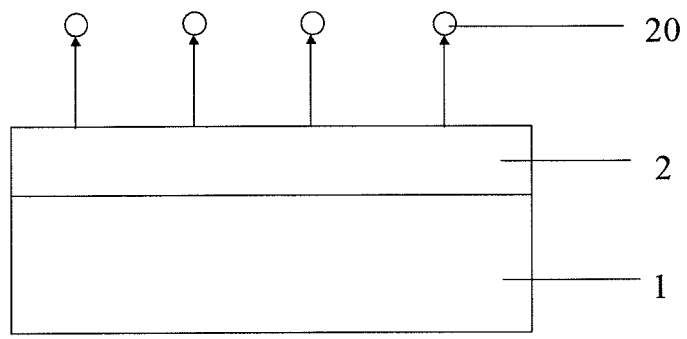
FIG. 3a-b show diagrammatical, illustrative view of prior art decomposition.
Figure 3B:
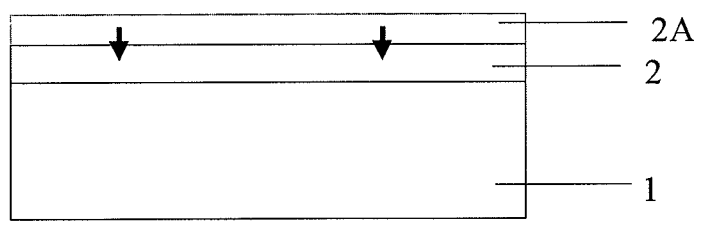
Figure 4A:
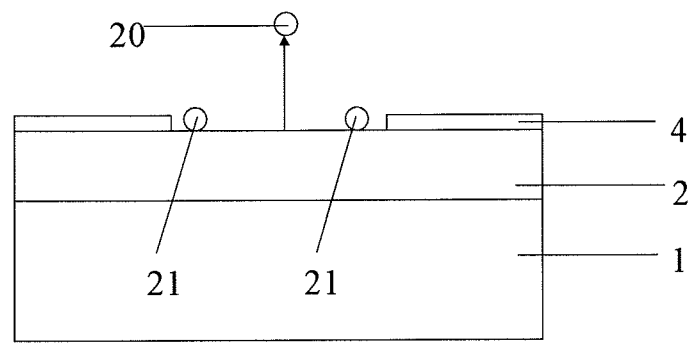
FIG. 4a-b show diagrammatical, illustrative views of one embodiment of the method.
Figure 4B:
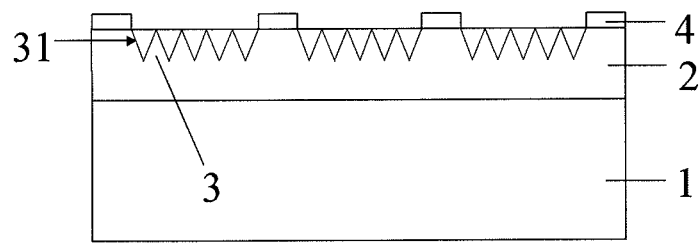

FIGS. 3a and 3b, 4a and 4b are diagrammatical figures explaining molecular mechanisms behind one embodiment. FIGS. 3a and 3b show herein the decomposition without application of a mask. FIGS. 4a and 4b show the decomposition and redeposition that occurs when if mask is present.

Typically, decomposition of GaN involves sublimation of solid-phase GaN into gaseous GaN (shown as dots 20 in FIG. 3a). When hydrogen is present in the atmosphere, the sublimation may lead to a reaction with Ga, GaH, N$_2$ and NH$_3$ as reaction products. A careful analysis has been published by M. A. Mastro et al., *Phys. Stat. Sol (a)*, 188 (2001), 467-471, which is incorporated herein by reference. As specified in the article, annealing in H$_2$ at 900° C. resulted in the complete sublimation of the GaN film. FIG. 3b shows the result wherein a portion 2a of the transmission layer 2 of GaN has been decomposed by sublimation. It is observed in the article that annealing in an NH$_3$ atmosphere leads to GaN films that are relatively stable.

FIGS. 4a and 4b show the surprising effect of application of a mask. Now, the mask generates a different process, wherein the annealing, particularly in an atmosphere comprising both hydrogen and ammonia, results in decomposition and redeposition. Herein, sublimation of solid phase GaN into gaseous components 20 still occurs. The available ammonia appears to shift the balance of the sublimation reaction back to solid-phase GaN. However, the GaN (indicated with dots 21) is now incorporated into the lattice of the layer on other positions. In this manner, the more energetically favorable crystal facets 31 are created. Reference is made here to GaN as if it were a molecule that makes a transition from gas phase back into the solid phase. This is not necessarily a physically correct description of the crystallization process. Ga could be a gas phase single atom that only binds with nitrogen upon integration into the crystal lattice.

In one suitable embodiment, the transmission layer with the textured surface is used as a surface plasmonic structure, particularly in a method of detection of individual molecules and/or their properties. Thereto, a nanostructure is present in which radiation is confined. The nanostructure is suitably provided with tilted sidewalls. The nanostructure with tilted sidewalls may be or comprise a nanopore with a varying diameter across the membrane, and, in cross-sectional view, a substantially triangular shape. The textured surface is most suitably covered with an electrically conductive layer, for instance a metal such as a noble metal. One therefore may suitably express the method in the embodiment of detection of transmitted radiation as a method comprising the steps of:

directing electromagnetic radiation onto the nanostructure in the direction of the first major surface, using thereto the textured layer as a surface plasmonic structure, translocating molecules through the nanostructure, and detecting electromagnetic radiation that exists from the nanostructure away from the second major surface, transmission of electromagnetic radiation through the nanostructure being at least by excitation of surface plasmon polaritons in the nanostructure.

The method is particularly suitable for detection of individual molecules. Thereto, the nanostructure is suitably configured to limit the passage of a sample material through the nanostructure to a single molecule at a time. The molecule is for instance a double stranded nucleic acid molecule or a single stranded nucleic acid molecule or a polypeptide molecule or a single ribosome or a cell or a viral particle. The molecule is translocated through the nanostructure by means of any suitable driving force, e.g. by electrophoresis. Radiation originating from at least one light source, such as a laser or a led or another light source. The light interacts with the molecule inside the nanopore 6, this interaction is the basis for biomolecular analysis. Hence the nanopore can be an optical confinement. Suitably, electromagnetic radiation such as light that has been transmitted through the nanopore (rather than only reflected light) is used for the measurements. The detection of the radiation occurs by molecular spectroscopy, and more specifically by Raman spectroscopy, molecular fluorescence spectroscopy or surface enhance infrared absorption spectroscopy. Certain embodiments can involve the use of nanoparticles to enhance the Raman signal obtained from nucleotides. The nanoparticles may be silver or gold nanoparticles, although any nanoparticles capable of providing a surface enhanced Raman spectroscopy (SERS), surface enhanced resonance Raman spectroscopy (SERRS) and/or coherent anti-Stokes Raman spectroscopy (CARS) signal may be used, e.g. Ag, Au, Cu, Al, Ni, Pt, Pd, particularly noble metals.

The textured surface is a surface plasmonic structure that can influence the behavior of optically active molecules in several ways. Firstly, due to the focusing of electromagnetic radiation to nanovolumes, molecules can be excited more efficiently. Secondly, the plasmon resonance perturbs the local electromagnetic mode density, modifying the decay rate of local dipole emitters. Such nano-antennas are particularly suitable in case that Raman spectroscopy, molecular fluorescence or surface enhanced infrared absorption spectroscopy is used.

In the case, e.g., of Raman spectroscopy, this double effect leads to the well known E4 dependence of the Raman scattering intensity on the local electric field. It further enables probing of vibrational transitions using optical excitation. Additional enhancement can be achieved using resonance Raman (illuminating in resonance with an electronic transition of the target molecule) or coherent anti-stokes Raman scattering (CARS) (a non-linear, 4-wave mixing process). Raman spectroscopy is particularly suitable for sensing segments of larger molecules, such DNA molecules.

Preferably, the nanostructure with tilted sidewalls is created such as to create an electromagnetic hotspot. The hotspot is the location where the optical interaction is strongest and where structural or chemical information is harvested. It provides a smaller sensing region than what can be achieved with traditional lens structures or photonic components. The field confining structure provides plasmonic field confinement leading to localization based on gap mode resonance, at the hotspot. As a result, the electromagnetic field gets concentrated in the hotspot. Therewith, the hotspot effectively amplifies the optical signal. The electromagnetic field results from the interaction of the electromagnetic radiation with the matter present. Means for enhancement of the field strength, and thus means for creation of the hotspot, include plasmon carrying metal structures, in particular nano-antennas, and a nanostructure in which cavity effects occur, particularly with a varying diameter. In the latter case, the nanostructure is preferably designed such that the hotspot is present at the position at which the—inner-diameter is smallest. However, alternative shapes of the nanostructure leading to resonance in a limited volume thereof are not excluded.

In one embodiment, the textured surface as obtainable with the method is used, wherein the pattern of the mask is defined so as to guide the light towards the nanostructure. For instance, the textured surface has a stripe-shaped surface area with at one end the nanostructure. In a further implementation, all elements (e.g. the light emitting element, the textured layer, the nanostructure and the detection method) are tuned to a single operation wavelength. In a further implementation, the nanostructure may be obtained by selective growth of a GaN layer, as is further elaborated in patent application PCT/EP2009/066739, which is incorporated herein by reference.

In a further embodiment, the light source is not an external light source, but is present within the substrate. Light emitted from the light source, typically a light emitting diode, is then transmitted via the textured surface to the nanostructure. While transmission spectroscopy—and hence a nanostructure extending through the substrate—is favorably is used, another form of optical detection is not excluded. While the textured surface may be used as a plasmonic structure to provide a desired orientation to the light, it is not excluded that an additional optical element such as a mirror is used in addition to the textured surface.

Though the textured surface obtainable with the method appears most suitable for use as part of a surface plasmonic structure, it is not excluded that a prior art textured surface is used that is obtained with f.i. wet chemical etching with KOH.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of fabricating a light-emitting semiconductor device, the method comprising:
   providing a light-emitting layer stack;
   forming a stop layer over the light-emitting layer stack;
   forming a light-transmission layer on the stop layer, the light-transmission layer formed of a crystalline III-V semiconductor material that is optically transmissive to emission wavelengths of the light-emitting layer stack;
   patterning a mask layer on the light-transmission layer such that portions of the light-transmission layer are exposed;
   thermally texturing in an atmosphere comprising molecular hydrogen ($H_2$) and ammonia, the thermally texturing comprises decomposing the light-transmission layer at the exposed portions into chemical constituents of the III-V semiconductor material and redepositing to form a plurality of crystals of the III-V semiconductor material having triangular crystal facets; and
   stopping the thermal texturing by locally stopping the decomposing and redepositing at an interface formed by the stop layer and the light-transmission layer, wherein the stop layer has a decomposition temperature that is higher than that of the light-transmission layer such that texturing is prevented from extending into the stop layer.

2. The method of claim 1, wherein the decomposing comprises heating to a temperature that is sufficient to decompose the crystalline III-V material while insufficient to decompose the stop layer.

3. The method of claim 2, wherein the thermally texturing comprises the decomposing and the redepositing simultaneously in a single process.

4. The method of claim 2, wherein the III-V semiconductor material is a nitride semiconductor and the thermally texturing comprises providing nitrogen atoms of the nitride semiconductor at least in part by the decomposing and the redepositing in the atmosphere comprising the molecular hydrogen ($H_2$) and ammonia.

5. The method of claim 1, wherein the thermally texturing is carried out at atmospheric pressure and less than 1250° C.

6. The method of claim 1, wherein the III-V semiconductor material is selected from the group consisting of GaN, InGaN, AlGaN, AlInGaN and InN.

7. The method of claim 6, wherein the III-V semiconductor material is GaN, and the stop layer is formed of AlN or AlGaN.

8. The method of claim 6, wherein the III-V semiconductor material is InGaN, and the stop layer is formed of one of AlN, AlGaN or GaN.

9. The method of claim 1, further comprising, after patterning the mask layer, removing at least portions of the patterned mask layer and replacing with at least one metal contact.

10. The method of claim 1, wherein providing the light-emitting layer stack comprises forming a light emitting element interposed between a p-type device layer and a n-type device layer by growing one of the p-type device layer or the n-type device layer on a silicon substrate having (111) crystal orientation.

11. A method of fabricating a light-emitting semiconductor device, the method comprising:
providing a light-emitting layer stack;
forming a first nitride semiconductor layer on the light-emitting layer stack and a polycrystalline second nitride semiconductor layer on the first nitride semiconductor layer;
patterning a mask layer on the second nitride semiconductor layer to expose portions of the polycrystalline second nitride semiconductor layer; and
selectively texturing in an atmosphere comprising molecular hydrogen ($H_2$) and ammonia, the selectively texturing comprises decomposing the polycrystalline second nitride semiconductor layer at the exposed portions into chemical constituents of the polycrystalline second nitride semiconductor layer and redepositing to form a textured second nitride semiconductor layer comprising a plurality of crystals of the second nitride semiconductor having triangular crystal facets; and
stopping the selective texturing by locally stopping the decomposing and the redepositing at an interface formed by the stop layer and the polycrystalline second nitride semiconductor layer,
wherein the selectively texturing leaves the first nitride semiconductor layer untextured.

12. The method of claim 11, wherein the selectively texturing includes heating at a temperature that is sufficient to decompose the polycrystalline second nitride layer while being insufficient to decompose the first nitride layer, such that texturing is stopped from extending into the first layer.

13. The method of claim 12, wherein the selectively texturing includes heating at a temperature between about 800° C. and about 1150° C.

14. The method of claim 11, wherein the polycrystalline second nitride semiconductor layer is formed of a material selected from the group consisting of GaN, InGaN, AlGaN, AlInGaN and InN.

15. The method of claim 14, wherein the textured second nitride semiconductor layer is in a phase having a hexagonal crystal structure such that the crystals have a pyramidal structure having the triangular crystal facets.

16. The method of claim 14, wherein providing the light-emitting layer stack comprises providing a light-emitting quantum well stack prior to forming the first nitride semiconductor layer thereon, wherein at least the polycrystalline second nitride semiconductor is optically transmissive in light wavelengths corresponding to an emission wavelength of the light-emitting quantum-well stack.

17. The method of claim 16, wherein the selectively texturing includes heating at a temperature for a time duration sufficient to form the plurality of crystals having an average size between about 300 nm and about 800 nm, such that a light transmissivity of the textured second nitride semiconductor is higher compared to a light transmissivity of the polycrystalline second nitride semiconductor.

18. The method of claim 16, further comprising doping the textured second nitride semiconductor layer and the first nitride semiconductor layer to form a p-doped region of the light emitting semiconductor device, and wherein the active layer stack further comprises an n-doped region.

* * * * *